US012765252B2

(12) United States Patent
Lee et al.

(10) Patent No.: US 12,765,252 B2
(45) Date of Patent: Oct. 13, 2026

(54) DISPLAY DEVICE

(71) Applicant: Samsung Display Co., LTD., Yongin-si (KR)

(72) Inventors: Younghoon Lee, Gwangmyeong-si (KR); Young Seo Choi, Yongin-si (KR); Young Ji Kim, Hwaseong-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 762 days.

(21) Appl. No.: 18/113,800

(22) Filed: Feb. 24, 2023

(65) Prior Publication Data

US 2023/0292584 A1 Sep. 14, 2023

(30) Foreign Application Priority Data

Mar. 10, 2022 (KR) ........................ 10-2022-0030210

(51) Int. Cl.

| | |
|---|---|
| ***H10K 77/10*** | (2023.01) |
| ***H10K 59/12*** | (2023.01) |
| ***H10K 59/131*** | (2023.01) |
| ***H10K 59/80*** | (2023.01) |
| *H10K 102/00* | (2023.01) |

(52) U.S. Cl.

CPC ....... *H10K 77/111* (2023.02); *H10K 59/1201* (2023.02); *H10K 59/131* (2023.02); *H10K 59/873* (2023.02); *H10K 2102/311* (2023.02)

(58) Field of Classification Search

CPC .... H10K 77/111; H10K 59/873; G09F 9/301; G06F 1/1641

See application file for complete search history.

(56) References Cited

U.S. PATENT DOCUMENTS

| | | | | |
|---|---|---|---|---|
| 9,287,329 | B1 * | 3/2016 | Lee | H10K 59/131 |
| 2014/0049449 | A1 * | 2/2014 | Park | G09G 3/035 29/841 |
| 2017/0338294 | A1 | 11/2017 | Choi et al. | |
| 2018/0013095 | A1 * | 1/2018 | Choi | H10K 59/8722 |
| 2019/0074332 | A1 * | 3/2019 | Kim | G01K 13/00 |
| 2020/0004077 | A1 | 1/2020 | Lee et al. | |
| 2021/0313387 | A1 | 10/2021 | Bang et al. | |
| 2022/0102468 | A1 | 3/2022 | Lee et al. | |
| 2023/0121948 | A1 | 4/2023 | Lee et al. | |

FOREIGN PATENT DOCUMENTS

| | | |
|---|---|---|
| KR | 10-2017-0132382 A | 12/2017 |
| KR | 10-2018-0060710 | 6/2018 |
| KR | 10-2020-0002047 A | 1/2020 |

(Continued)

*Primary Examiner* — Douglas M Menz

(74) *Attorney, Agent, or Firm* — Innovation Counsel LLP

(57) ABSTRACT

A display device includes a first area, a second area, and a bending area; a first substrate that is disposed at least in the first area where a display layer is disposed, and is formed of a glass material; a second substrate that is disposed on the first substrate, is disposed at least in the bending area and the second area, and is bendable; an organic material layer that is disposed at least in the bending area and the second area; an encapsulation layer that is disposed on the display layer; and a signal line that extends from the display layer and is disposed in the bending area and the second area, wherein the first substrate is spaced apart from the second area.

14 Claims, 11 Drawing Sheets

(56) References Cited

FOREIGN PATENT DOCUMENTS

| | | | |
|---|---|---|---|
| KR | 10-2020-0049329 | | 5/2020 |
| KR | 10-2020-0130571 | A | 11/2020 |
| KR | 10-2020-0144626 | | 12/2020 |
| KR | 10-2021-0019617 | | 2/2021 |
| KR | 10-2021-0086284 | | 7/2021 |
| KR | 10-2021-0122955 | A | 10/2021 |
| KR | 10-2023-0056103 | | 4/2023 |

* cited by examiner

| Wheel Cut | Laser Cut |
|---|---|
|  |  |

DISPLAY DEVICE

CROSS-REFERENCE TO RELATED APPLICATION

This application claims priority to and the benefit of Korean Patent Application No. 10-2022-0030210 under 35 U.S.C. § 119, filed in the Korean Intellectual Property Office (KIPO) on Mar. 10, 2022, the entire contents of which are incorporated herein by reference.

BACKGROUND

1. Technical Field

The disclosure relates to a display device.

2. Description of the Related Art

Electronic devices based on mobility are widely used. In addition to small electronic devices such as mobile phones, tablet PCs are widely used as mobile electronic devices.

Such a mobile electronic device includes a display device to provide visual information such as a motion picture to a user in order to support various functions. Recently, as other components for driving the display device are down-sized, the proportion of the display device in the electronic device is gradually increasing, and a structure that can be bent to have a predetermined angle in a flat state is being developed.

The above information disclosed in this Background section is only for enhancement of understanding of the background of the invention, and therefore it may contain information that does not form the prior art that is already known in this country to a person of ordinary skill in the art.

SUMMARY

Embodiments are to provide a display device of which some areas are bendable, thereby reducing a dead space occupied by a peripheral area in size, while maintaining reliability of a substrate.

A display device according to an embodiment includes a first area, a second area, and a bending area; a first substrate that is disposed at least in the first area where a display layer is disposed, and is formed of a glass material; a second substrate that is disposed on the first substrate, is disposed at least in the bending area and the second area, and is bendable; an organic material layer that is disposed at least in the bending area and the second area; an encapsulation layer that is disposed on the display layer; and a signal line that extends from the display layer and is disposed at least in the bending area and the second area, wherein the first substrate is spaced apart from the second area.

The second substrate may be disposed over the first area, the bending area, and the second area, and the display device further comprises a barrier layer disposed on the second substrate in the first area.

The first substrate may overlap at least a part of the second substrate disposed in the second area, and the second substrate disposed in the second area may be connected to the first substrate.

The first substrate may include a first side adjacent to the bending area, and the first side may have protrusions and depressions.

The second substrate may include a carbonized region that is disposed at least in the bending area and the second area.

The carbon content of the carbonized region may be greater than the carbon content of remaining areas of the second substrate.

A thickness of the carbonized region may be about 20 nanometers to about 40 nanometers.

The first substrate may include a first side adjacent the bending area, and the first side may have a shape that is inclined with respect to a side of the second substrate.

A distance between a first edge and a second edge of the first side may be about 30 micrometers to about 500 micrometers.

A glass residual layer may be disposed on a rear surface of the second substrate in at least a part of the bending area and the second area.

The display device may further include a protection layer that is disposed at least in the bending area and the second area.

A display device according to an embodiment includes a first area, a second area, and a bending area; a first substrate that is disposed at least in the first area where a display layer is disposed; a second substrate that is disposed at least in the bending area and the second area; an organic material layer that is disposed at least in the bending area and the second area; an encapsulation layer that is disposed on the display layer; and a signal line that extends from the display layer and is disposed at least in the bending area and the second area, wherein the second substrate may include a carbonized region that is disposed at least in the bending area and at least a part of the second area.

A thickness of the carbonized region may be about 20 nanometers to about 40 nanometers.

The first substrate may not be disposed in the bending area and the second area.

The second substrate may be disposed over the first area, the bending area, and the second area.

A second substrate may be disposed over the bending area and the second area, and may be spaced apart from the first area.

The display device may further include a protection layer disposed on a rear surface of the second substrate in the bending area and the second area.

A display device according to an embodiment includes a first area, a second area, and a bending area; a first substrate that is disposed at least in the first area where a display layer is disposed, and is formed of a glass material; a second substrate that is disposed at least in the bending area and the second area, and has flexibility; an organic material layer that is disposed at least in the bending area and the second area; an encapsulation layer that is disposed on the display layer; and a signal line that extends from the display layer and is disposed at least in the bending area and the second area, wherein an end of the first substrate has a shape that is tapered toward the bending area.

A glass residual layer that is disposed in at least a part of the bending area and the second area may be positioned on a rear surface of the second substrate.

The display device may further include a protection layer that is disposed at least in the bending area and the second area.

According to the embodiments, since some area are bendable, it is possible to provide the display device in which the area of the dead space occupied by the peripheral area is reduced while maintaining the reliability of the substrate.

DETAILED DESCRIPTION OF THE EMBODIMENTS

Figure 1:
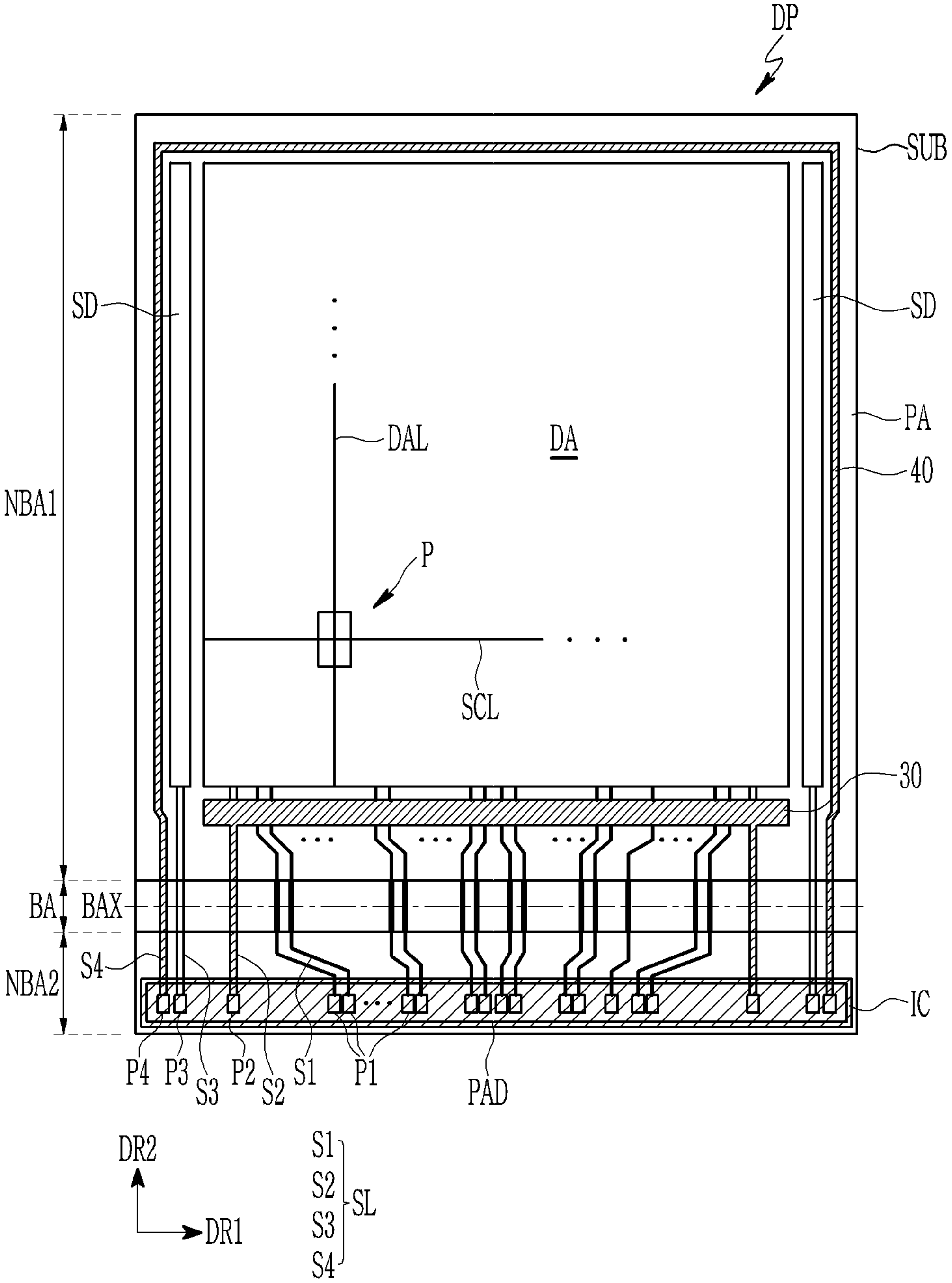
FIG. 1 is a schematic plan view of a display device according to an embodiment of the present invention.

The disclosure will be described more fully hereinafter with reference to the accompanying drawings, in which embodiments of the disclosure are shown. As those skilled in the art would realize, the described embodiments may be modified in various different ways. The disclosure may be implemented in several different ways and is not limited to the embodiments described herein.

The drawings and description are to be regarded as illustrative in nature and not restrictive. Like reference numerals designate like elements throughout the specification.

In addition, since the size and thickness of each configuration shown in the drawings are arbitrarily indicated for better understanding and ease of description, the disclosure is not necessarily limited to the drawings. In the drawings, the thickness of layers, films, panels, regions, etc., may be exaggerated for clarity. In addition, in the drawing, the thickness of some layers and regions may be exaggerated for better understanding and ease of description.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, throughout the specification, the word "on" a target element will be understood to mean positioned above or below the target element, and will not necessarily be understood to mean positioned "at an upper side" based on an opposite to gravity direction.

In addition, unless explicitly described to the contrary, the words "comprise", "include", and "have" and variations thereof such as "comprises" or "comprising", will be understood to imply the inclusion of stated elements but not the exclusion of any other elements.

Further, throughout the specification, the phrase "on a plane" or "in a plan view" means viewing a target portion from the top, and the phrase "on a cross-section" or "in a cross-sectional view" means viewing a cross-section formed by vertically cutting a target portion from the side.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The term "and/or" includes all combinations of one or more of which associated configurations may define. For example, "A and/or B" may be understood to mean "A, B, or A and B."

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, a display device according to an embodiment will be described with reference to FIGS. 1 to 3. FIG. 1 is a schematic plan view of a display device according to an embodiment of the disclosure, FIGS. 2A and 2B are schematic cross-sectional views of the display device according to the embodiment, and FIG. 3 is a schematic enlarged view of an area of a substrate according to the embodiment.

A display device DP may include a first area NBA1, a bending area BA, and a second area NBA2 that are disposed in a second direction DR2. The display device DP may be bent around a bending axis BAX that is parallel to a first direction DR1. A bending portion of the display device DP bent around the bending axis BAX may have a same curvature radius with reference to the bending axis BAX, but the disclosure is not limited thereto. As another embodiment, the display device DP is bent around the bending axis BAX, but the curvature radius of the bending portion may not be constant.

Figure 2A:
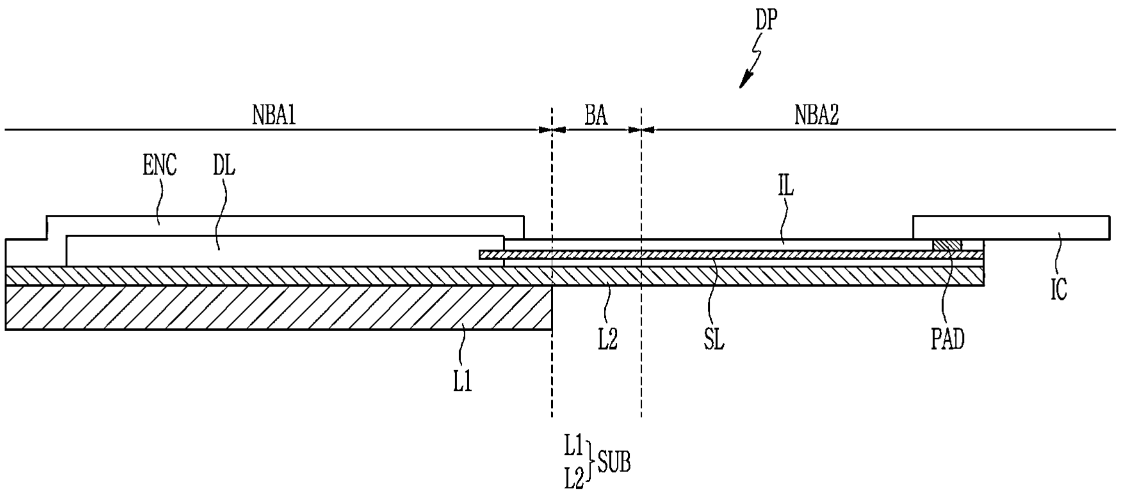
FIG. 2A and FIG. 2B are schematic cross-sectional views of the display device according to the embodiment.
Figure 2B:
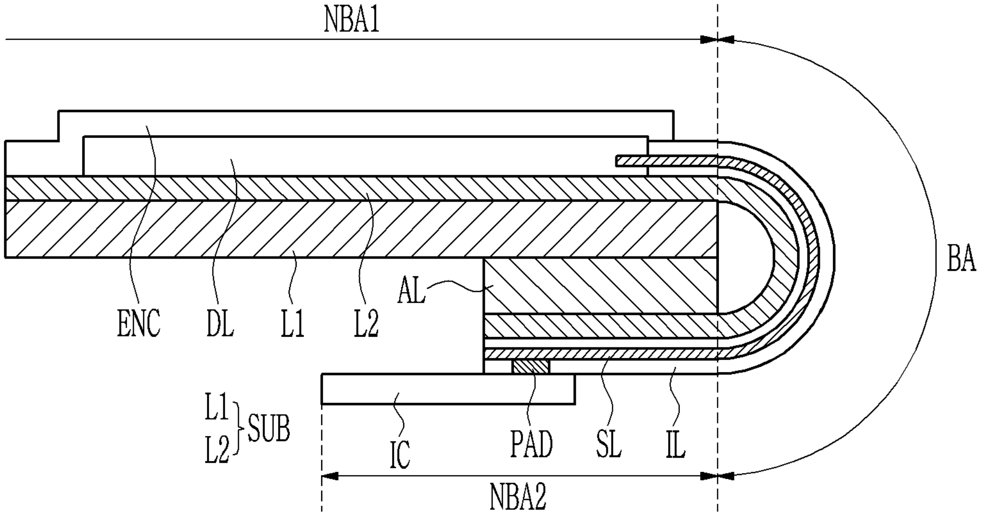
Figure 3:
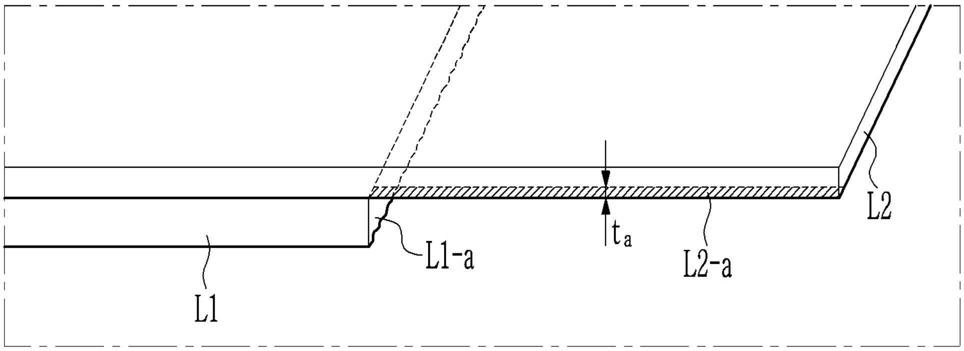
FIG. 3 is a schematic enlarged view of some area of a substrate according to the embodiment.

The display device DP according to the embodiment may include a first substrate L1 and a second substrate L2 as shown in FIGS. 2A and 2B.

The first substrate L1 may contain organic or inorganic materials. As an embodiment, the first substrate L1 may be a glass substrate with a material including silicon (Si), for example, $SiO_2$ as a main component. The first substrate L1 may be a rigid substrate that does not bend.

The second substrate L2 may contain an organic material. As an embodiment, the second substrate L2 may include an organic insulating material such as plastic such as polyimide. The second substrate L2 may be a flexible substrate that is bent along the bending axis BAX.

The first area NBA1 may include a display area DA. As shown in FIG. 1, the first area NBA1 may include the display area DA and a portion of a non-display area PA at an outer side of the display area DA. The second area NBA2 and the bending area BA may include the non-display area PA. The display area DA of the display device DP may correspond to a portion of the first area NBA1, and the non-display area PA may correspond to the remainder of the first area NBA1, the second area NBA2, and the bending area BA.

The display area DA is a region where pixels P are disposed. The display area DA may be formed of (or formed as or may include) a display layer DL, and a detailed stack structure will be described with reference to FIG. 4.

The display layer DL may provide an image using light emitted from each pixel P. The pixel P may be connected to signal lines such as a scan line SCL extended in the first direction DR1 and a data line DAL extended in the second direction DR2. Although not illustrated in FIG. 1, the pixel P may be connected with power lines that transmit a DC current, such as a driving power line, a common power line, and the like. The display layer DL may be covered with an encapsulation layer ENC that overlaps the first substrate L1.

The pixel P may include a pixel circuit that is electrically connected with the above-described signal line and power lines, and a display element, for example, a light emitting element (or light emitting diode). The pixel P may emit light, for example, red, green, and blue or white light through a light emitting element.

The non-display area PA may include a scan driver SD, a pad portion PAD, a driving voltage supply line 30, a common voltage supply line 40, and a signal wire (or signal line) SL.

The scan drivers SD may be disposed in the first area NBA1. The scan drivers SD may be spaced apart from each other with the display area DA interposed therebetween. The scan driver SD may generate a scan signal and transmit it to each pixel P through the scan line SCL. FIG. 1 illustrates that two scan drivers are disposed, but the disclosure is not limited thereto. As another embodiment, a scan driver may be disposed to a side of the display area DA.

The pad portion PAD may be disposed to an end of the non-display area PA, for example, in the second area NBA2, and includes pads P1, P2, P3, and P4. The pad portion PAD is exposed without being covered by an insulation layer, and can be connected to a driver IC.

The driving voltage supply line 30 may provide a driving voltage to pixels P. The driving voltage supply line 30 may be disposed in the non-display area PA so as to be adjacent to a side of the display area DA.

The common voltage supply line 40 may provide a common voltage to pixels P. The common voltage is a voltage applied to a cathode of the light emitting element, and the common voltage supply line 40 may be disposed in the non-display area PA to partially surround the display area DA.

The signal wire SL may include a first signal wire S1, a second signal wire S2, a third signal wire S3, and a fourth signal wire S4. The first signal wire S1, the second signal wire S2, the third signal wire S3, and the fourth signal wire S4 are disposed between an end of the display area DA and the pad portion PAD, and may extend in the second direction DR2. The first signal wire S1 electrically connects the signal line and the pad portion PAD of the display area DA, and the second signal wire S2 electrically connects the driving voltage supply line 30 and the pad portion PAD. The third signal wire S3 electrically connects the scan driver SD and the pad portion PAD, and the fourth signal wire S4 electrically connects the common voltage supply line 40 and the pad portion PAD.

In the specification, although the pads P1, P2, P3, and P4 of the pad portion PAD are described as member numbers that are different from the first signal wire S1, the second signal wire S2, the third signal wire S3, and the fourth signal wire S4, each of the pads P1, P2, P3, and P4 may be a portion of the first signal wire S1, the second signal wire S2, the third signal wire S3, and the fourth signal wire S4. For example, an end portion of the first signal wire S1 may correspond to the pad P1, an end portion of the second signal wire S2 may correspond to the pad P2, an end portion of the third signal wire S3 may correspond to the pad P3, and an end portion of the fourth signal wire S4 may correspond to the pad P4.

The signal wire SL extends in a direction intersecting the bending axis BAX for example, thereby passing through the bending area BA. FIG. 1 illustrates that the first signal wire S1, the second signal wire S2, the third signal wire S3, and the fourth signal wire S4 are vertical with respect to the bending axis BAX, but the disclosure is not limited thereto. The first signal wire S1, the second signal wire S2, the third signal wire S3, and the fourth signal wire S4 are extended obliquely to have an angle (e.g., a predetermined or selectable angle) with respect to the bending axis BAX, or may extend while having various shapes such as a curved line shape that is not a straight line shape, a zigzag shape, a serpentine shape, and the like.

The signal wire SL including the first signal wire S1, the second signal wire S2, the third signal wire S3, and the fourth signal wire S4 may extend from the display layer DL and may be positioned in the bending area BA and the second area NBA2 as shown in FIG. 2A. The signal wire SL may be disposed on an organic layer (or organic material layer) IL positioned in the bending area BA and the second area NBA2.

The organic layer IL may be disposed to cover at least a portion of the bending area BA and the second area NBA2. The organic layer IL may include sub-organic layers, and any one of the sub-organic layers may include an opening corresponding to the pad portion PAD. The organic layer IL and the sub-organic layer formed on the display layer DL may be formed of a same material in the same process.

The first substrate L1 may overlap the first area NBA1, and may not overlap the bending area BA and the second area NBA2. The first substrate L1 may be spaced apart from the bending area BA and the second area NBA2. No substrate of glass material may be positioned in bending area BA and the second area NBA2.

The second substrate L2 may overlap the bending area BA and the second area NBA2 (e.g., in a direction or in a view). Depending on embodiments, the second substrate L2 may overlap the first area NBA1. The second substrate L2 extends from the first area NBA1, and may be positioned over the bending area BA and the second area NBA2. In the first area NBA1, the second substrate L2 may be positioned on the first substrate L1.

As shown in FIGS. 1 and 2B, the second substrate L2 may bend along the bending axis BAX. The second substrate L2 overlapping the second area NBA2 in the bent state may be positioned on a rear surface (or rear side) of the first substrate L1. At least a portion of the second substrate L2 overlapping the second area NBA2 may overlap the first substrate L1. Since only the second substrate L2 with flexibility is positioned in the bending area BA, it may be easy to bend the second substrate L2. In the bent state, a rear surface of the second substrate L2 may be combined with the rear surface of the first substrate L1. Depending on embodiments, the rear surface of the second substrate L2 and the rear surface of the first substrate L1 may be combined through an adhesive layer AL.

Hereinafter, referring to FIG. 3, the first substrate L1 and the second substrate L2 will be described in more detail. FIG. 3 is an enlarged view that schematically illustrates the first substrate L1 and the second substrate L2.

Referring to FIG. 3, the first substrate L1 may include a first side L1-*a* adjacent to the bending area BA. The first side L1-*a* may include irregular or regular protrusions and depressions. In case that a wheel cutting or laser cutting process is used in the process of partially removing the first substrate L1 of the glass material, a side surface of the first substrate L1 may have an uneven shape.

The second substrate L2 according to the embodiment may include a carbonized area (or carbonized region) L2-*a* overlapping the bending area BA and at least a portion of the second area NBA2. The carbon content of the carbonized area L2-*a* may be greater than the carbon content of the remaining second substrate L2 except for the carbonized area L2-*a*. A thickness to of the carbonized area L2-*a* may be about 20 to about 40 nanometers, but is not limited thereto, and it may be changed depending on a thickness of and a manufacturing process of the second substrate L2.

Figure 4:
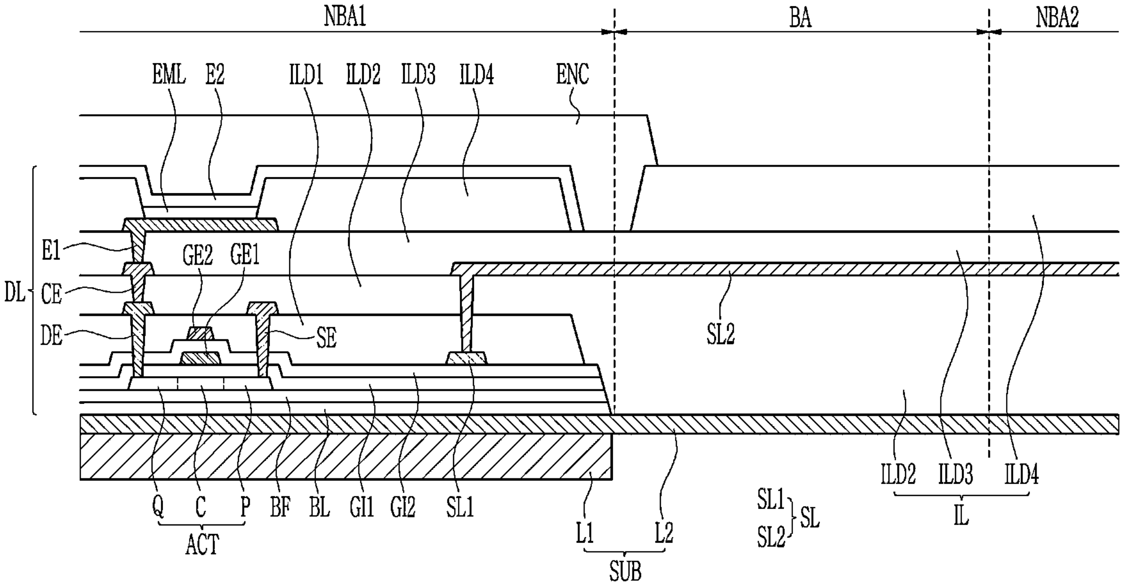
FIG. 4 is a schematic cross-sectional view of the display device according to the embodiment.

Hereinafter, referring to FIG. 4, a detailed stack structure of the display layer DL and an insulation layer IL will be described. FIG. 4 is a schematic cross-sectional view of the display device according to the embodiment.

A barrier layer BL may be positioned on a substrate SUB according to the embodiment. The barrier layer BL may be positioned on the second substrate L2 and overlap the first area NBA1. The barrier layer BL may include an inorganic material such as a silicon nitride, a silicon oxide, or a silicon oxynitride. In case that the second substrate L2 is omitted in the first area NBA1, the barrier layer BL may be omitted.

A buffer layer BF may be positioned on the barrier layer BL. The buffer layer BF may block the transfer of impurities from the substrate SUB to an upper layer of the buffer layer BF, particularly, a semiconductor layer ACT, thereby preventing characteristic degradation of the semiconductor layer ACT and reducing stress. The buffer layer BF may include an inorganic insulating material or an organic insulating material such as a silicon nitride or a silicon oxide. A portion or all of the buffer layer BF may be omitted.

The semiconductor layer ACT is positioned on the buffer layer BF. The semiconductor layer ACT may include at least one of polysilicon and an oxide semiconductor. The semiconductor layer ACT includes a channel area C, a first area P, and a second area Q. The first area P and the second area Q are disposed on sides of the channel area C, respectively. The channel area C may include a semiconductor doped with a small amount of an impurity or undoped with an impurity, and the first area P and the second area Q may include a semiconductor doped with a large amount of an impurity compared to the channel area C. The semiconductor layer ACT may be formed of an oxide semiconductor. A separate protective layer (not shown) may be added to protect the oxide semiconductor material, which is vulnerable to external environments such as a high temperature.

A first gate insulation layer GI1 is positioned on the semiconductor layer ACT.

A gate electrode GE1 is positioned on the first gate insulation layer GI1. The gate electrode GE1 may be a single layer or a multilayer in which a metal film including at least one of copper (Cu), a copper alloy, aluminum (Al), an aluminum alloy, molybdenum (Mo), a molybdenum alloy, titanium (Ti), and a titanium alloy is laminated. The gate electrode GE1 may overlap the channel area C of the semiconductor layer ACT.

A second gate insulation layer GI2 may be positioned on the gate electrode GE1 and the first gate insulation layer GI1. The first gate insulation layer GI1 and the second gate insulation layer GI2 may be a single layer or a multilayer including at least one of a silicon oxide ($SiO_x$), a silicon nitride ($SiN_x$), and a silicon oxynitride ($SiO_xN_y$).

An upper electrode GE2 may be positioned on the second gate insulation layer GI2. The upper electrode GE2 may form a storage capacitor while overlapping at least a portion of the gate electrode GE1.

A first interlayer insulation layer ILD1 is positioned on the upper electrode GE2. The first interlayer insulation layer ILD1 may be a single layer or a multilayer including at least one of a silicon oxide ($SiO_x$), a silicon nitride ($SiN_x$), and a silicon oxynitride ($SiO_xN_y$).

A source electrode SE and a drain electrode DE are positioned on the first interlayer insulation layer ILD1. The source electrode SE and the drain electrode DE are respectively connected to the first area P and the second area Q of the semiconductor layer ACT through contact holes formed in the insulation layers.

A second interlayer insulation layer ILD2 is positioned on the first interlayer insulation layer ILD1, the source electrode SE, and the drain electrode DE.

A connection electrode CE may be positioned on the second interlayer insulation layer ILD2. The connection electrode CE, the source electrode SE, and the drain electrode DE may include aluminum (Al), silver (Ag), magnesium (Mg), gold (Au), nickel (Ni), chromium (Cr), calcium (Ca), molybdenum (Mo), titanium (Ti), tungsten (W), and/or copper (Cu), and may be a single-layer or multi-layer structure including the same.

A third interlayer insulation layer ILD3 may be positioned on the connection electrode CE. The second interlayer insulation layer ILD2 and the third interlayer insulation layer ILD3 may include an organic insulation material such as a general-purpose polymer such as poly(methyl methacrylate) (PMMA) or polystyrene (PS), polymer derivatives with phenolic groups, acryl-based polymers, imide-based polymers, polyimides, acryl-based polymers, siloxane-based polymers, and the like.

A first electrode E1 may be positioned on the third interlayer insulation layer ILD3. The first electrode E1 may be connected to the connection electrode CE through a contact hole of the third interlayer insulation layer ILD3, and may be electrically connected to the drain electrode DE.

The first electrode E1 may include a metal such as silver (Ag), lithium (Li), calcium (Ca), aluminum (Al), magnesium (Mg), or gold (Au), or may include a transparent conductive oxide (TCO) such as an indium tin oxide (ITO) and an indium zinc oxide (IZO). The first electrode E1 may be formed of a single layer including a metallic material or a transparent conductive oxide, or a multi-layer including these. For example, the first electrode E1 may have a triple layer structure of indium tin oxide (ITO)/silver (Ag)/indium tin oxide (ITO).

A transistor formed of the gate electrode GE1, the semiconductor layer ACT, the source electrode SE, and the drain electrode DE is connected to the first electrode E1 to supply a current to the light emitting element.

A partitioning wall ILD4 is positioned on the third interlayer insulation layer ILD3 and the first electrode E1. Although not shown, a spacer (not shown) may be positioned on the partitioning wall ILD4. The partitioning wall ILD4 overlaps at least a portion of the first electrode E1 and has an opening of a pixel defining layer that defines a light emitting area.

The partitioning wall ILD4 may include an organic insulation material such as a general-purpose polymer such as poly(methyl methacrylate) or polystyrene, polymer derivatives with phenolic groups, acryl-based polymers, imide-based polymers, polyimides, acryl-based polymers, siloxane-based polymers, and the like.

An emission layer EML is positioned on the first electrode E1. A functional layer (not shown) may be positioned above and below the emission layer EML. A first functional layer may include at least one of a hole injection layer (HIL) and a hole transport layer (HTL), and a second functional layer may be a multilayer including at least one of an electron transport layer (ETL) and an electron injection layer (EIL).

A second electrode E2 is positioned on the emission layer EML. The second electrode E2 may include a reflective metal including calcium (Ca), barium (Ba), magnesium (Mg), aluminum (Al), silver (Ag), gold (Au), nickel (Ni), chromium (Cr), lithium (Li), calcium (Ca), and the like, or a transparent conductive oxide (TCO) such as an indium tin oxide (ITO) or an indium zinc oxide (IZO).

The first electrode E1, the emission layer EML, and the second electrode E2 may form a light emitting element. The first electrode E1 may be an anode that is a hole injection electrode, and the second electrode E2 may be a cathode that is an electron injection electrode. However, the embodiment is not limited thereto, and depending on a method of driving the light emitting display device, the first electrode E1 may become a cathode and the second electrode E2 may become an anode.

Holes and electrons are respectively injected into the emission layer EML from the first electrode E1 and the second electrode E2, and light emission occurs in case that excitons that are a combination of the injected holes and electrons fall from an exited state to a ground state.

The encapsulation layer ENC is positioned on the second electrode E2. The encapsulation layer ENC may cover and seal not only a top surface of the light emitting element, but also side surfaces. Since the light emitting element is very vulnerable to moisture and oxygen, the encapsulation layer ENC seals the light emitting element to block the inflow of external moisture and oxygen.

The encapsulation layer ENC may include layers, among which it may be formed as a composite film including both an inorganic layer and an organic layer. For example, it may be formed as a triple layer in which a first encapsulation inorganic layer, an encapsulation organic layer, and a second encapsulation inorganic layer are sequentially formed.

Although not illustrated in the specification, a capping layer positioned between the second electrode E2 and the encapsulation layer ENC may be further included. The capping layer may include an organic material. The capping layer protects the second electrode E2 from a subsequent process, e.g., a sputtering process and improves light output efficiency of the light emitting element.

The organic layer IL extending to the bending area BA and the second area NBA2 may be a second interlayer insulation layer ILD2, a third interlayer insulation layer ILD3, and a partitioning wall ILD4. However, the disclosure is not limited thereto, and the organic layer IL may be variously modified according to the stacked structure of the display layer DL.

The signal wire SL may include a first sub-signal wire SL1 and a second sub-signal wire SL2. The first sub-signal wire SL1 and the upper electrode GE2 may be positioned on a same layer, and the second sub-signal wire SL2 and the connection electrode CE may be positioned on a same layer. However, the signal wire SL is not limited thereto, and may be variously modified according to the stacked structure of the display layer DL, and may be formed on any layer the same as the metal wire. The signal wire SL may extend from the first area NBA1 to the second area NBA2 through the bending area BA.

Hereinafter, referring to FIGS. 5 to 10, a display device according to an embodiment will be described. FIGS. 5 to 10 are schematic cross-sectional views of a display device according to an embodiment. A description of the same constituent elements as the above-described embodiment(s) will be omitted below.

Figure 5:
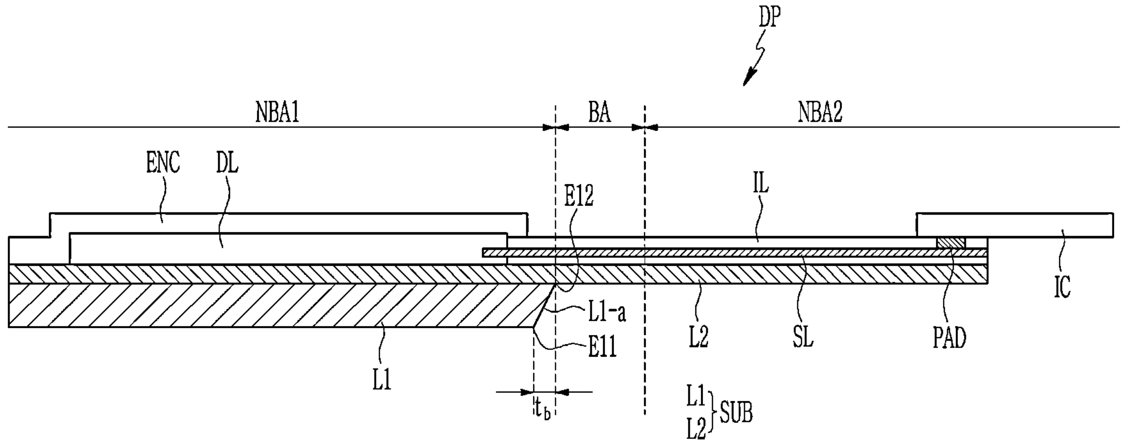
FIGS. 5 to 10 are schematic cross-sectional views of a display device according to an embodiment.

First, referring to FIG. 5, a first side L1-*a* of a first substrate L1 according to an embodiment may have a shape inclined toward a bending area BA. For example, the first side L1-*a* of the first substrate L1 may have a tapered shape.

The first side L1-*a* of the first substrate L1 may have a first edge E11 and a second edge E12. A distance $t_b$ between the first edge E11 and the second edge E12 may be about 30 micrometers to about 500 micrometers.

The first substrate L1 may be positioned only in the first area NBA1, and a glass substrate positioned in the second area NBA2 and the bending area BA may be removed. A process in which at least a part of the glass substrate is removed may use an etching process as an example. An end of the first substrate L1 manufactured through the etching process may have a tapered shape toward the second substrate L2.

Figure 6:
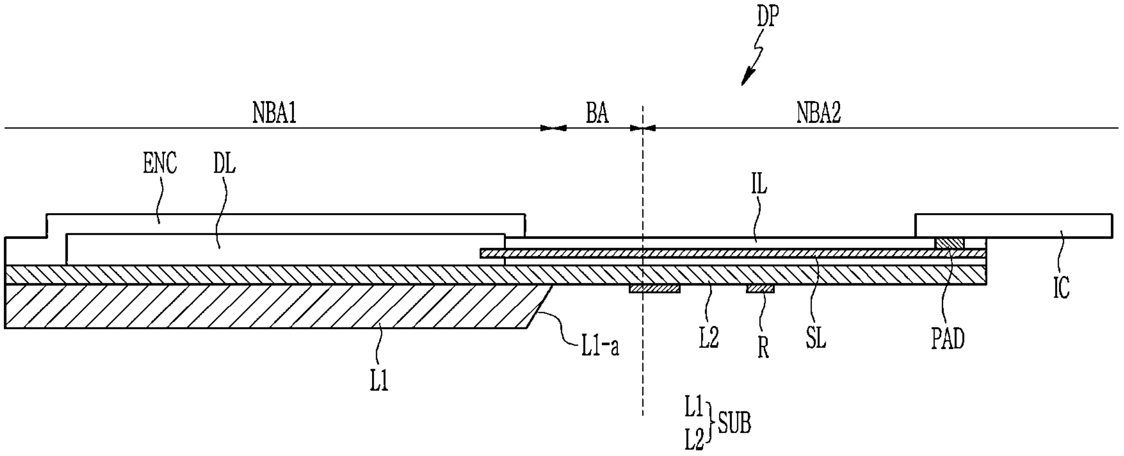

Referring to FIG. 6, a glass residual layer (or remaining glass film) R may be positioned in the bending area BA and the second area NBA2 according to the embodiment. The glass residual layer R may be formed while a portion of the glass substrate remains during the etching process. The glass residual layer R may have a very thin thickness, and for example, may have a thickness of 30 micrometers or less. The glass residual layer R may have an irregular shape. Depending on embodiments, in case that the glass substrate positioned in the bending area BA and the second area NBA2 is completely removed, the glass residual layer R may not be formed.

Figure 7:
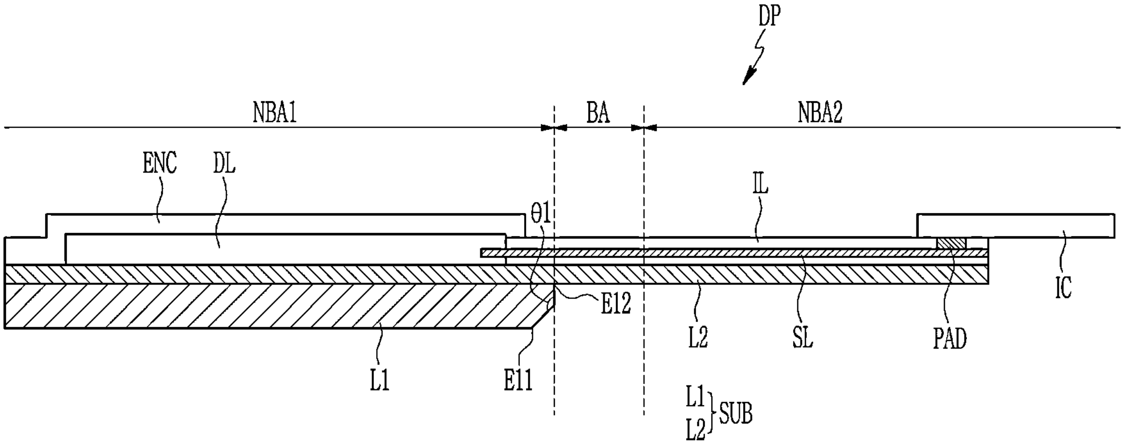

Referring to FIG. 7, a side of the first substrate L1 according to the embodiment may include a side inclined with respect to a bottom surface of the first substrate L1. Although FIG. 7 illustrates that a side has a flat shape in the specification, it is not limited thereto, and it may have a curved shape. A rear surface of the first substrate L1, the inclined surface, and a portion of the side of the first substrate L1 perpendicular to the rear surface of the second substrate L2 may form a predetermined angle, but is not limited thereto, and may have a smooth shape. The inclined surface may form a first angle Θ1 with a side of the first substrate L1 that is perpendicular to a surface of the second substrate L2. The first angle Θ1 may be greater than 90 degrees to less than 180 degrees.

In FIG. 7, the first substrate L1 may have a first edge E11 and a second edge E12. As shown in FIG. 5, a minimum distance between the first edge E11 and the second edge E12 may be from about 30 micrometers to about 500 micrometers.

Figure 8:
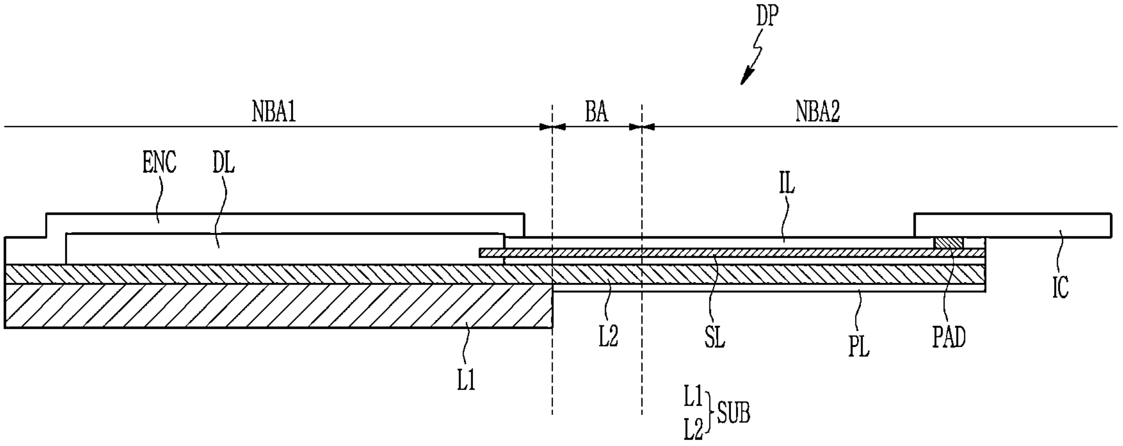

Referring to FIG. 8, the display device according to the embodiment may further include a protection layer PL that is positioned in the bending area BA and the second area NBA2. The protection layer PL may protect the second substrate L2 positioned in the bending area BA and the second area NBA2. For example, the protection layer PL may block moisture and oxygen from flowing into the second substrate L2 from the outside. The protection layer PL may be provided in the form of a film or resin, but is not limited thereto.

Figure 9:
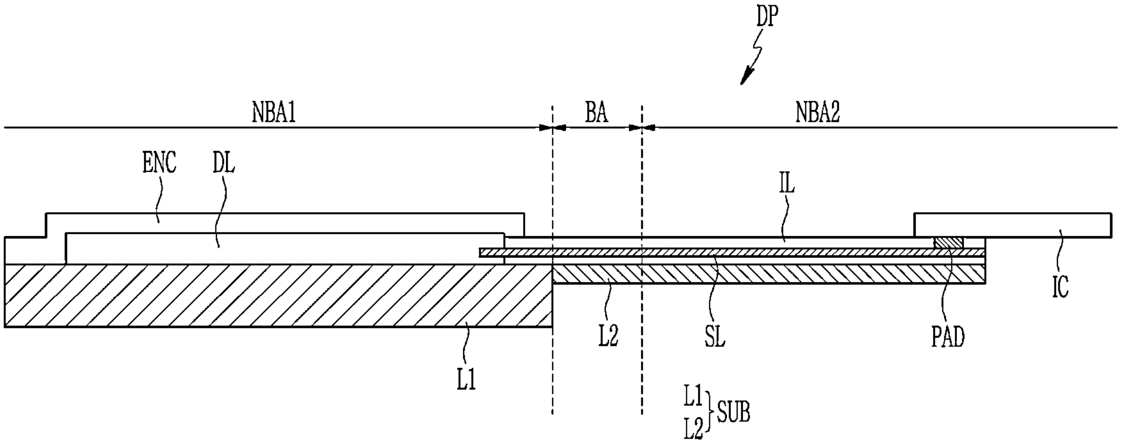

Referring to FIG. 9, a second substrate L2 according to an embodiment may overlap a bending area BA and a second area NBA2. The second substrate L2 may be separated from the first area NBA1. For example, only a rigid first substrate L1 may be positioned in a first area NBA1, and the flexible second substrate L2 may be positioned in the bending area BA and the second area NBA2. A side of the second substrate L2 and a side of the first substrate L1 may have a contact shape, but is not limited thereto.

Figure 10:
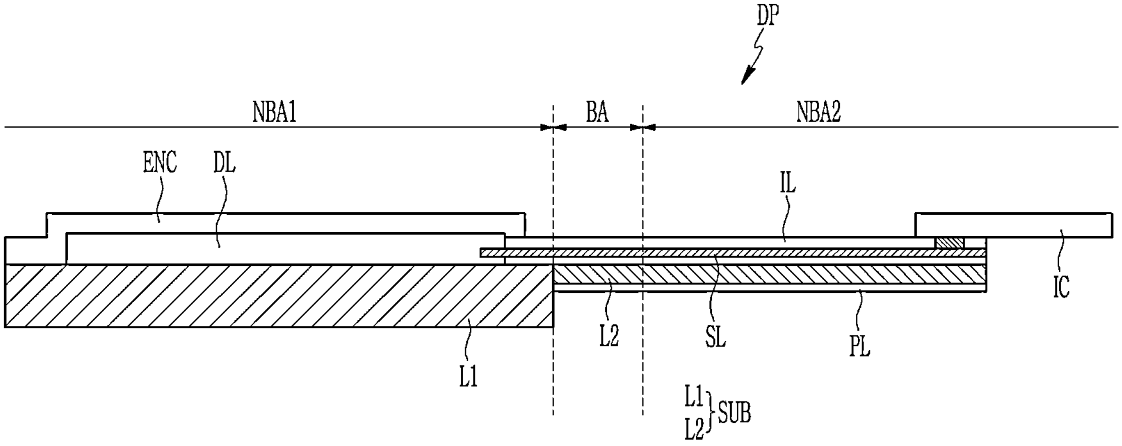

Referring to FIG. 10, a display device according to an embodiment may further include a protection layer PL positioned in a bending area BA and a second area NBA2 compared to the display device of FIG. 9. The protection layer PL may protect the second substrate L2 positioned in the bending area BA and the second area NBA2. For example, the protection layer PL may block moisture and oxygen from flowing into the second substrate L2 from the outside. The protection layer PL may be provided in the form of a film or resin, but is not limited thereto.

Hereinafter, a display device according to an embodiment will be described with reference to FIGS. 11 to 14. FIGS. 11 to 14 are schematic cross-sectional views of display devices according to embodiments. A description of the same constituent elements as the above-described constituent elements may be omitted.

Figure 11:
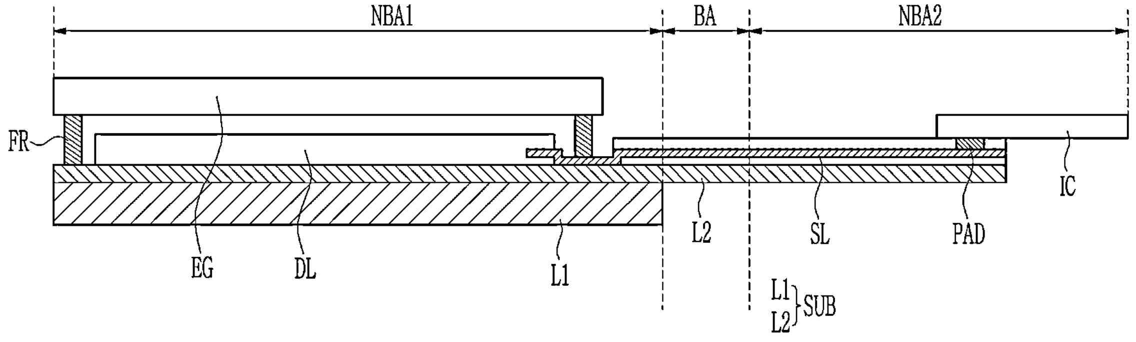
FIGS. 11 to 14 are schematic cross-sectional views of display devices according to embodiments.

First, referring to FIG. 11, a substrate SUB according to an embodiment may include a first substrate L1 positioned in a first area NBA1, the first area NBA1, and a second substrate L2 positioned throughout the first area NBA1, a bending area BA and a second area NBA2. The second substrate L2 may be positioned on the first substrate L1.

The first substrate L1 may be a material containing silicon (Si), for example, a glass substrate of a glass material containing $SiO_2$, as a main component. The first substrate L1 may be a rigid substrate that does not bend.

The second substrate L2 may contain an organic material. As an embodiment, the second substrate L2 may include an organic insulating material such as plastic such as polyimide. The second substrate L2 may be a flexible substrate that bends along a bending axis.

A display layer DL positioned on the second substrate L2 may be disposed in the first area NBA1. A specific stacked structure of the display layer DL is as described above, but a barrier layer BL may be omitted depending on embodiments.

A signal wire SL extended from the display layer DL may extend along the bending area BA and the second area NBA2, and may be electrically connected to a driver IC through a pad portion PAD.

The display layer DL may be covered with an encapsulation substrate EG that overlaps the first substrate L1. The embodiment of FIG. 11 is different from the above-stated embodiment in that an encapsulation substrate EG and a sealing member FR are included instead of the above-stated encapsulation layer.

The encapsulation substrate EG may overlap the first substrate L1. A width of the encapsulation substrate EG may be equal to or smaller than a width of the first substrate L1. The encapsulation substrate EG and the substrate SUB, particularly, the encapsulation substrate EG and the second substrate L2, may be combined through the sealing member FR.

The sealing member FR may enclose the display layer DL. The sealing member FR may be disposed on the second substrate L2 to enclose the display layer DL. A space defined by the substrate SUB, the encapsulation substrate EG, and the sealing member FR is spatially separated from the outside to prevent penetration of external moisture or impurities.

The encapsulation substrate EG may be a glass substrate or a resin substrate. The sealing member FR may contain inorganic materials such as frits or organic materials such as epoxies.

Figure 12:
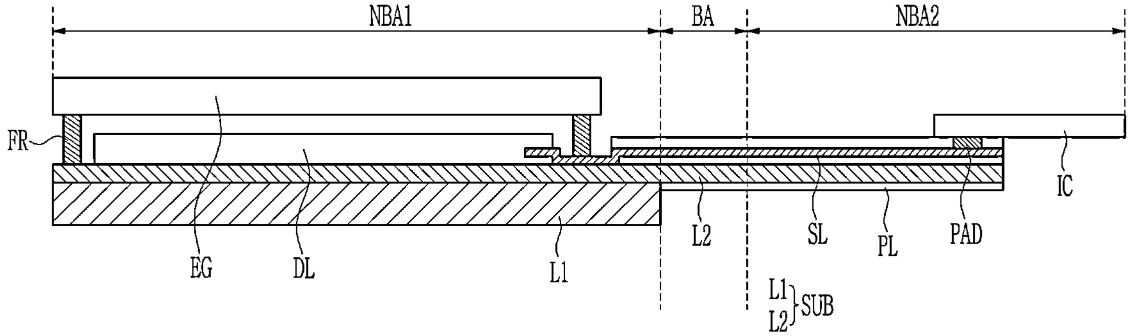

Referring to FIG. 12, a display device according to an embodiment may further include a protection layer PL compared to the display device described with reference to FIG. 11. The protection layer PL may protect a second substrate L2 while positioned in a bending area BA and a second area NBA2. For example, the protection layer PL may block moisture and oxygen from flowing into the second substrate L2 from the outside. The protection layer PL may be provided in the form of a film or resin, but is not limited thereto.

Figure 13:
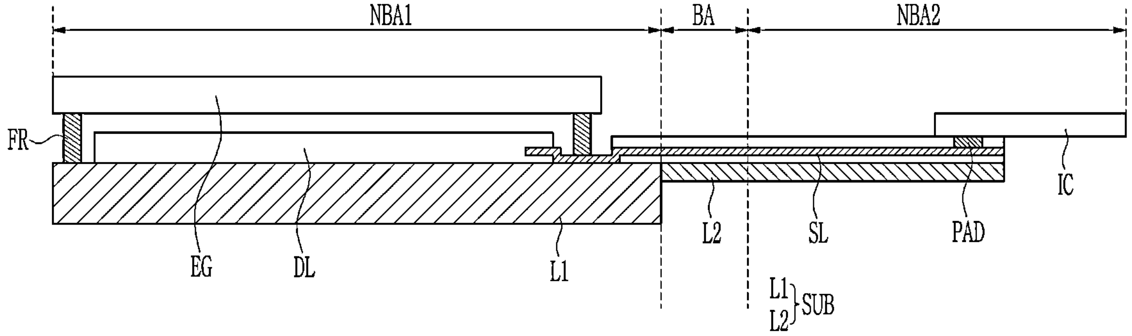

Referring to FIG. 13, a display device according to an embodiment is different from the display device described with reference to FIG. 11 in that a second substrate L2 is separated from a first area NBA1. The second substrate L2 may be positioned only in a bending area BA and a second area NBA2, and a first substrate L1 may be positioned only in the first area NBA1.

Figure 14:
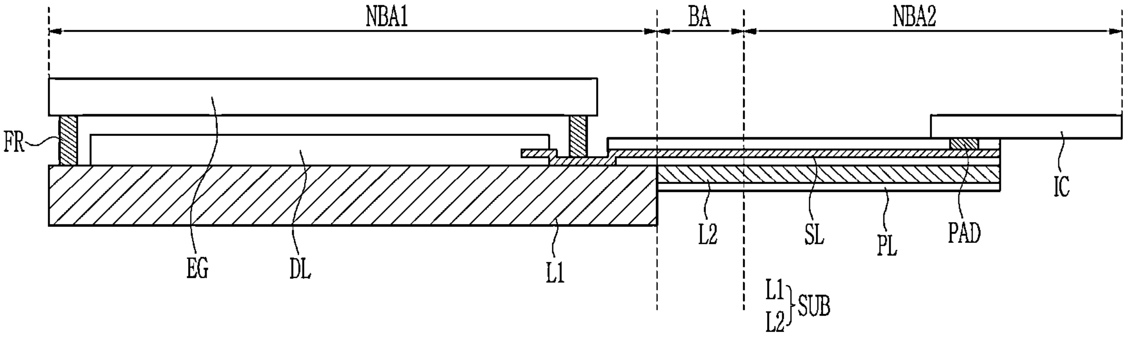

Referring to FIG. 14, a display device according to an embodiment may further include a protection layer PL positioned on a rear surface of a second substrate L2 compared to the display device described with reference to FIG. 13.

Figure 15:
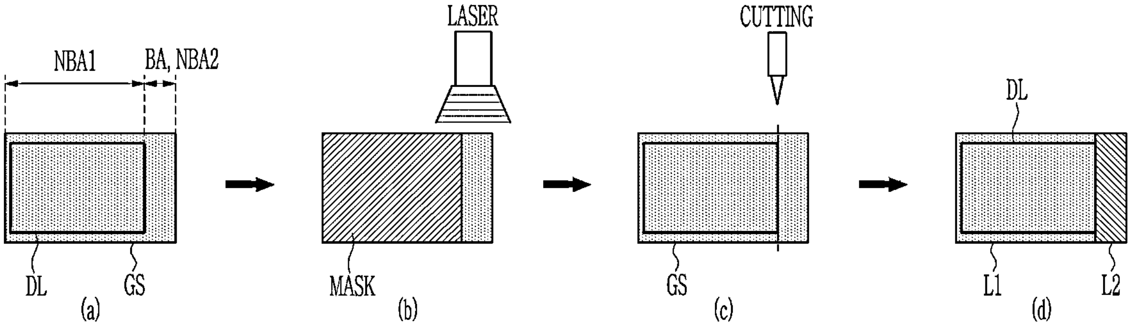
FIGS. 15 to 17 are schematic plan views that illustrate a manufacturing method of a display device according to an embodiment.
Figure 16:
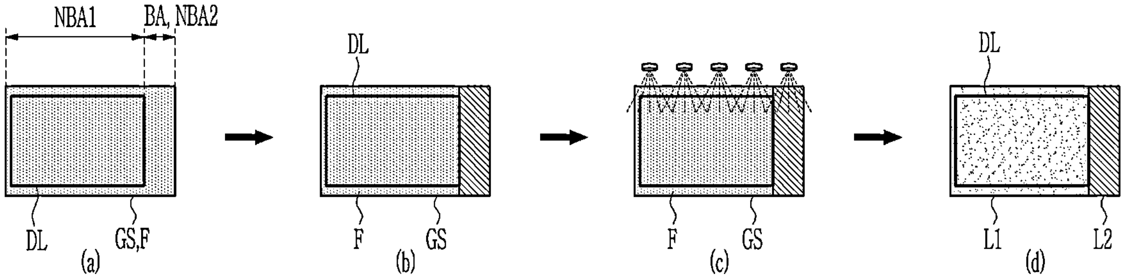
Figure 17:
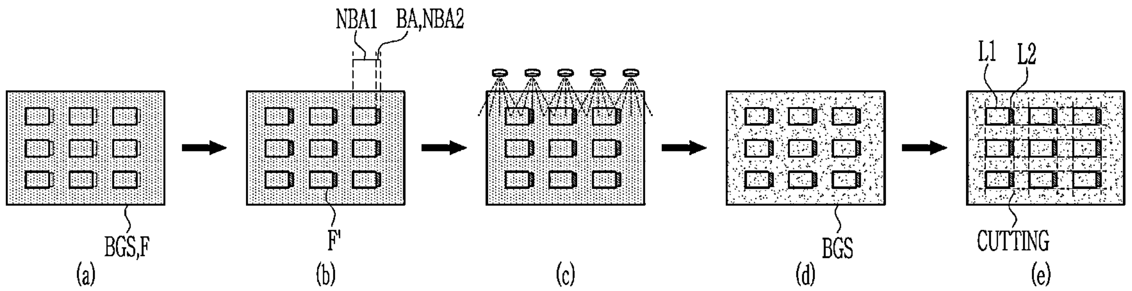

Hereinafter, a manufacturing method of a display device according to an embodiment will be described with reference to FIGS. 15 to 17. FIGS. 15 to 17 are schematic plan views that schematically illustrate a manufacturing method of a display device according to an embodiment. A description of the same constituent elements as the above-described constituent elements will be omitted.

Referring to FIG. 15 in addition to the above-described drawings, a glass substrate GS that overlaps the first area NBA1, the bending area BA, and the second area NBA2 is prepared (a). The above-described second substrate, the display layer DL, and the like may be sequentially formed on the glass substrate GS. A region overlapping the first area NBA1 is covered with a mask MASK, and the laser is irradiated to the bending area BA and the second area NBA2 (*b*). A cutting process such as wheel cutting or laser cutting is performed on the bending area BA and the second area NBA2 irradiated with the laser (c). The glass substrate overlapping the bending area BA and the second area NBA2 may be removed, and the first substrate L1 overlapping the first area NBA1, the first area NBA1, and the second substrate L2 overlapping the first area NBA1, the bending area BA and the second area NBA2 may be formed (d).

Referring to FIG. 16, a glass substrate GS overlapping the first area NBA1, the bending area BA, and the second area NBA2 is prepared. The above-described second substrate L2, the display layer DL, and the like may be sequentially formed on the glass substrate GS. An acid-resistant film F is disposed on a rear surface of the glass substrate GS (a). A portion of the acid-resistant film F overlapping the bending area BA and the second area NBA2 is removed (b). After that, the glass substrate exposed by the acid-resistant film F is etched and removed (c), and the acid-resistant film is removed to form the first substrate L1 overlapping the first area NBA1 and the second substrate L2 overlapping the first area NBA1, the bending area BA, and the second area NBA2 (*d*).

Referring to FIG. 17, the process described with reference to FIG. 16 can be performed on a large-area glass substrate. After preparing a large-area glass substrate BGS where display devices can be formed, an acid-resistant film F is disposed on a rear surface of the large-area glass substrate BGS (a). For each display device, a portion of the acid-resistant film F overlapping the bending area BA and the second area NBA2 is removed (b). After that, the large-area glass substrate BGS exposed by the acid-resistant film F' is etched (c), the acid-resistant film F' is removed after the etching process (d), and each display device is cut (e). Accordingly, each display device may include a first substrate L1 of a glass material overlapping the first area NBA1, and a second substrate L2 overlapping the first area NBA1, the bending area BA, and the second area NBA2.

Hereinafter, a display device according to an embodiment will be described with reference to FIGS. 18 to 21. FIGS. 18 to 21 are images of some areas of substrates manufactured according to the respective embodiments.

Figure 18:
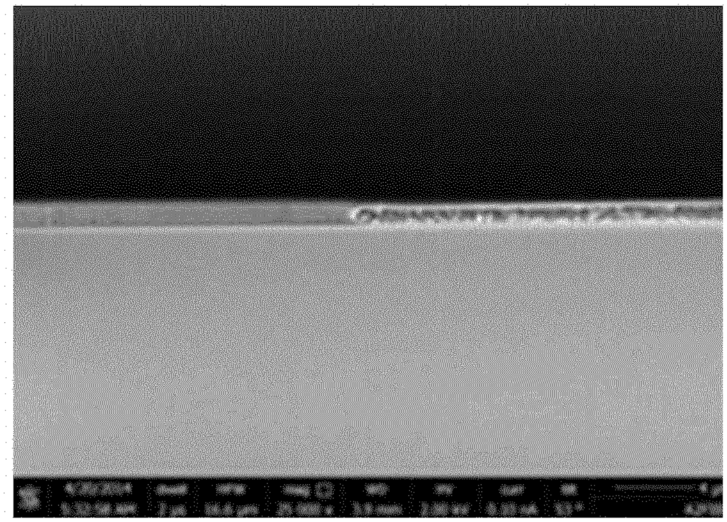
FIGS. 18 to 21 are images of some areas of substrates manufactured according to the respective embodiments.

First, referring to FIG. 18, it has been confirmed that a part of the second substrate according to the embodiment included a carbonized region. In case that the glass substrate positioned in the bending area and the second area was removed through the laser irradiation process, it has been confirmed that a part of the second substrate positioned in the bending area and the second area was carbonized.

Figure 19:
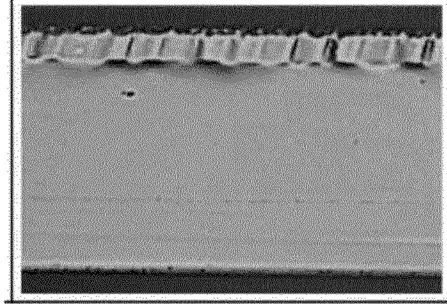
Figure 19:
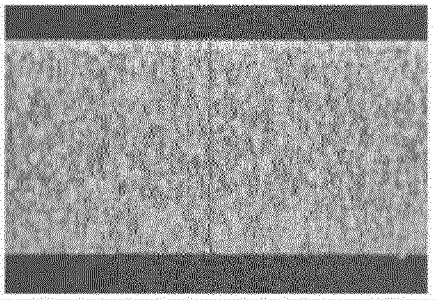

Referring to FIG. 19, in case that a part of the glass substrate is removed through the cutting process after irradiating the laser on the glass substrate positioned in the bending area and the second area, it has been confirmed that the side of the first substrate corresponding to the glass substrate has protrusions and depressions as shown on the left (wheel cutting) or has a unique surface pattern such as the one on the right (laser cut).

Figure 20:
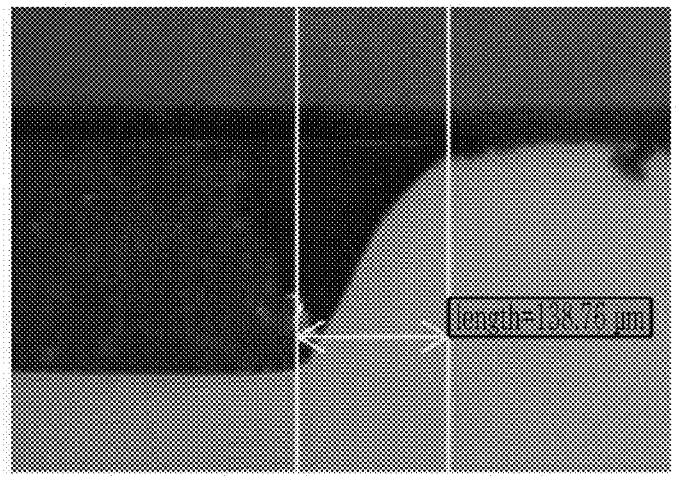

Referring to FIG. 20, in case that a glass substrate positioned in the bending area and the second area is removed using the etching process, it has been confirmed that the end of the first substrate has a tapered shape toward the second substrate.

Figure 21:
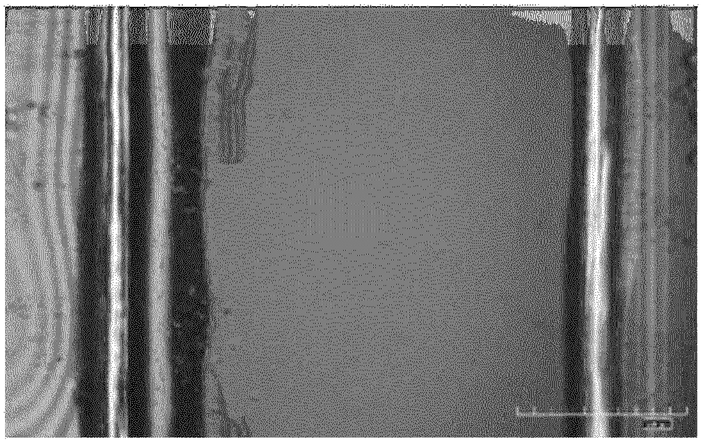

As shown in FIG. 21, in case that the glass substrate positioned in the bending area and the second area was removed using the etching process, it has been confirmed that a glass residual layer remained in at least a part of the second area and the bending area.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:

a first area, a second area, and a bending area;

a first substrate that is disposed at least in the first area where a display layer is disposed, and is rigid;

a second substrate that is disposed in on the first substrate, is disposed at least in the bending area and the second area, and is bendable;

an organic material layer that is disposed at least in the bending area and the second area;

an encapsulation layer that is disposed on the display layer; and a signal line that extends from the display layer and is disposed at least in the bending area and the second area, wherein the first substrate is spaced apart from the second area, and the encapsulation layer is disposed on a portion of the organic material layer, which is disposed at least in the bending area and the second area, in a direction away from the second substrate, wherein the second substrate comprises a carbonized region that is disposed at least in the bending area and the second area.

2. The display device of claim 1, wherein the second substrate is disposed over the first area, the bending area, and the second area, and the display device further comprises a barrier layer disposed on the second substrate in the first area.

3. The display device of claim 1, wherein the first substrate overlaps at least a part of the second substrate disposed in the second area, and the second substrate disposed in the second area is connected to the first substrate.

4. The display device of claim 1, wherein the first substrate comprises a first side adjacent to the bending area, and the first side has protrusions and depressions.

5. The display device of claim 1, wherein a carbon content of the carbonized region is greater than a carbon content of remaining areas of the second substrate.

6. The display device of claim 1, wherein a thickness of the carbonized region is about 20 nanometers to about 40 nanometers.

7. The display device of claim 1, wherein the first substrate comprises a first side adjacent the bending area, and the first side has a shape that is inclined with respect to a side of the second substrate.

8. The display device of claim 7, wherein a distance between a first edge and a second edge of the first side is about 30 micrometers to about 500 micrometers.

9. The display device of claim 1, wherein a glass residual layer is disposed on a rear surface of the second substrate in at least a part of the bending area and the second area.

10. The display device of claim 1, further comprising:

a protection layer that is disposed at least in the bending area and the second area.

11. A display device comprising:

a first area, a second area, and a bending area;

a first substrate that is disposed at least in the first area where a display layer is disposed;

a second substrate that is disposed at least in the bending area and the second area;

an organic material layer that is disposed at least in the bending area and the second area;

an encapsulation layer that is disposed on the display layer; and a signal line that extends from the display layer and is disposed at least in the bending area and the second area, wherein the second substrate comprises a carbonized region that is disposed at least in the bending area and at least a part of the second area, and wherein the second substrate is disposed over the first area, the bending area, and the second area.

12. A display device comprising:

a first area, a second area, and a bending area;

a first substrate that is disposed at least in the first area where a display layer is disposed, and is rigid;

a second substrate that is disposed at least in the bending area and the second area, and has flexibility;

an organic material layer that is disposed at least in the bending area and the second area;

an encapsulation layer that is disposed on the display layer; and a signal line that extends from the display layer and is disposed at least in the bending area and the second area, wherein an end of the first substrate has a shape that is tapered toward the bending area, and the encapsulation layer is disposed on a portion of the organic material layer, which is disposed at least in the bending area and the second area, in a direction away from the second substrate, wherein the second substrate comprises a carbonized region that is disposed at least in the bending area and the second area.

13. The display device of claim 12, wherein a glass residual layer is disposed on a rear surface of the second substrate in at least a part of the bending area and the second area.

14. The display device of claim 12, further comprising:

a protection layer that is disposed at least in the bending area and the second area.

* * * * *